United States Patent
Taninaka et al.

[11] Patent Number: 6,163,036
[45] Date of Patent: Dec. 19, 2000

[54] LIGHT EMITTING ELEMENT MODULE WITH A PARALLELOGRAM-SHAPED CHIP AND A STAGGERED CHIP ARRAY

[75] Inventors: Masumi Taninaka; Mitsuhiko Ogihara; Takatoku Shimizu, all of Minato-ku, Japan

[73] Assignee: Oki Data Corporation, Tokyo, Japan

[21] Appl. No.: 09/302,472

[22] Filed: Apr. 30, 1999

Related U.S. Application Data

[63] Continuation-in-part of application No. 08/929,760, Sep. 15, 1997, abandoned.

[51] Int. Cl.[7] .................................................. H01L 33/00
[52] U.S. Cl. ............................................. 257/88; 257/99
[58] Field of Search .............................. 257/79, 88, 89, 257/99; 362/800; 347/238, 130

[56] References Cited

FOREIGN PATENT DOCUMENTS

| | | |
|---|---|---|
| 0097261 | 1/1984 | European Pat. Off. . |
| 0319907 | 6/1989 | European Pat. Off. . |
| 2420848 | 10/1979 | France . |

OTHER PUBLICATIONS

"Light Emitting Diode", Yasuo Okuno, pp. 164–165, published by Sangyo Tosho Co., Ltd., Jan. 10, 1993.
Patent Abstracts of Japan, JP 02060767, Mar. 1, 1990.
Patent Abstracts of Japan, JP 58125879, Jul. 27, 1983.
Patent Abstracts of Japan, JP 02099350, Apr. 11, 1990.

*Primary Examiner*—Minh Loan Tran
*Attorney, Agent, or Firm*—Wenderoth, Lind & Ponack, L.L.P.

[57] ABSTRACT

A light emitting element module is provided in which plural chips, each of which includes plural light emitting elements, are arranged on a board. One side surface of each chip is expressed as a first side surface and another side surface of the chip which intersects the first side surface is expressed as a second side surface. Light emitting elements are located aside the first side surface at the upper side of the chip and arranged along the first side surface of said chips. The chips are arranged on the board so that at least two chips are displaced from each other to the right and left sides with respect to the chip alignment. Particularly, the plural chips may be disposed in a staggered arrangement on a board.

28 Claims, 7 Drawing Sheets

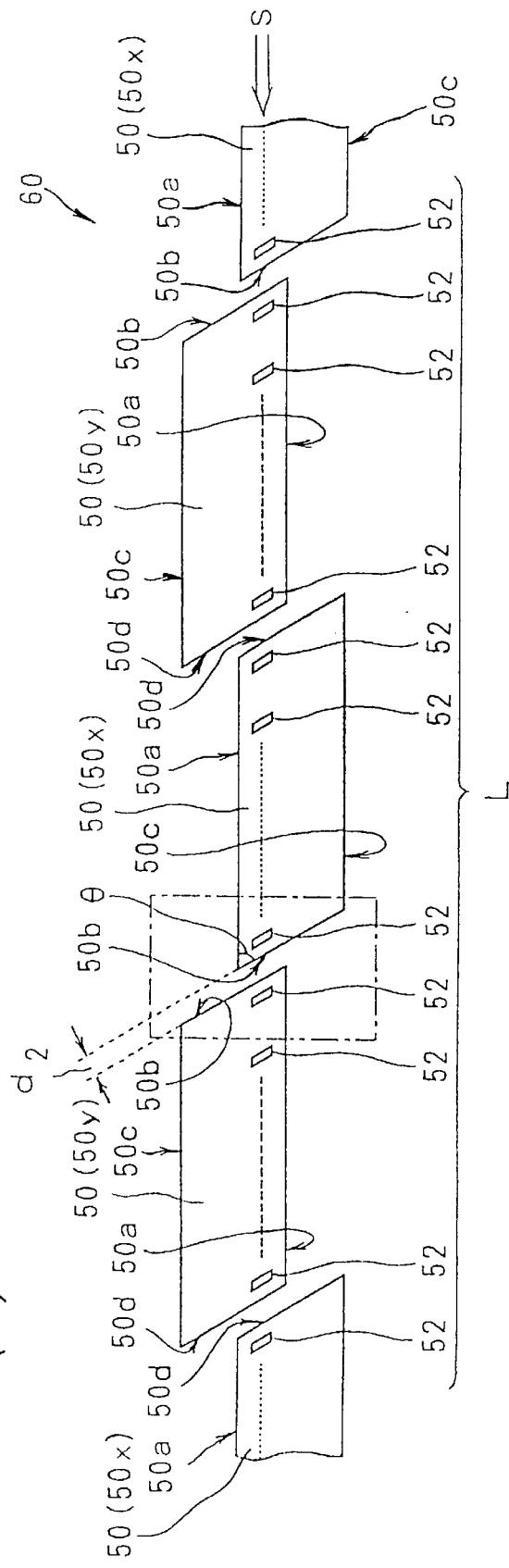
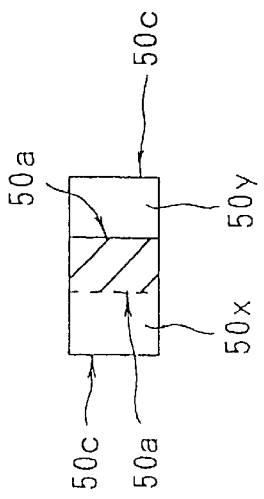
FIG. 4 (A)
FIG. 4 (B)

LIGHT EMITTING ELEMENT MODULE WITH A PARALLELOGRAM-SHAPED CHIP AND A STAGGERED CHIP ARRAY

This application is a Continuation-in-Part of application Ser. No. 08/929,760, filed Sep. 15, 1997, now abandoned.

BACKGROUND OF THE INVENTION

1. Field of the Invention

The present invention relates to light emitting element modules and chips.

2. Description of the Related Art

There has been known one type of light emitting element module in which a plurality of a rectangular-parallelepiped chips each including plural LEDs (Light Emitting Diodes) (i.e., "LED array") are arranged on a board (this type of light emitting element module is hereinafter referred to as "LED module").

As known in the prior art, an LED array may be constructed of a plurality of light-emitting elements incorporated in a chip so as to make a linear array of the light emitting elements. One well-known fabrication method of an LED array is disclosed in U.S. Pat. No. 5,523,590. The fabrication method disclosed in that reference deposits an insulating film of aluminum oxide ($AL_2O_3$) on a wafer comprising an n-type semiconductor substrate; patterns the insulating film by photolithography to form an array of rectangular openings; diffuses a p-type impurity such as zinc through the openings to form an array of p-type diffusion regions in the n-type substrate, thereby creating pn junctions; then deposits an aluminum film on the entire wafer and patterns the aluminum to form a set of electrodes, one electrode making contact with one of the p-type diffusion regions. Each pn junction functions as a light-emitting diode (LED).

When an LED module is applied as a light emitting device, it is used as a light source for an LED print head for use in an electrophotographic printer, for example. On the other hand, when an LED module is applied as a light emitting device having a photosensitive (photodetecting) function as well as a light emitting function, the LED module is also usable as a reading/writing head for reading and writing characters, images, etc.

FIG. 7 is a plan view which schematically shows a general LED module, and shows rectangular chips 70 constituting the LED module and the periphery thereof. Each of the rectangular chips 70 has a first side surface 70a, a second side surface 70b, a third side surface 70c and a fourth side surface 70d.

As shown in FIG. 7, each chip 70 has plural light emitting elements 72 which are arranged so as to be linearly aligned in a longitudinal direction of the chip and displaced (offset) from the longitudinal center line of the chip to one side of the chip. Here, the first side surface 70a is defined as one side surface of the chip 70 at which the light emitting elements 72 are arranged so as to be displaced (offset). The second side surface 70b is defined as another side surface of the chip 70 which intersects to the first side surface 70a. The third side surface 70c is defined as another side surface of the chip 70 which is opposed to the first side surface 70a. The fourth side surface 70d is defined as the residual side surface of the chip 70 which is located between the first side surface 70a and the third side surface 70c, intersects both the first and third side surfaces 70a and 70c, and is opposed to the second side surface 70b.

Accordingly, with respect to the chips 70 of the conventional LED module (light emitting element module), it is understood from FIG. 7 that all the plural light emitting elements 72 of each chip 70 having a substantially rectangular shape in plan view are disposed so as to be displaced (offset) from the center line of the chip 70. These plural light emitting elements 72 are located near to one side surface of the chip 70 (for example, the first side surface 70a), and are linearly aligned with one another.

Furthermore, the chips 70 are arranged at a predetermined chip interval on a board 74 so that an array line L is formed by the plural light emitting elements 72. In this case, the chips 70 are arranged on the board 74 so that the first side surface 70a of each chip 70 is located at one side area with respect to the array line L while the third side surface 70c of each chip 70 is located at the other side area with respect to the array line L (i.e., the first side surface 70a and the third side surface 70c are located at opposite sides with respect to the array line L as the boundary between both the side areas).

However, in the above-described conventional LED module (light emitting element module), the chips are arranged on the board so that the side surfaces of the neighboring chips confront each other over the entire width of the side surface of the chips. That is, the chips are arranged so as to be completely aligned with one another in the longitudinal direction of the chips as shown in FIG. 7. Therefore, during the mount/demount process in which a chip is disposed at a predetermined position or when a defective chip is removed from the board, there is a risk that the chip concerned will come into careless contact with neighboring chips and disturb the arrangement of the chips or damage the neighboring chips. Further, during the process in which a new chip is die-bonded to a portion of the board from which a defective chip has been removed, there is also a risk that the new chip win come into careless contact with the neighboring chips and disturb the arrangement of the chips or damage the neighboring chips. Particularly when the light emitting elements are arrayed in higher density (i.e., the resolution of the LFD module is higher), it is more difficult to keep a sufficient chip interval between the neighboring chips, and thus it is more and more difficult to arrange a chip at a predetermined position and remove a defective chip. This win be described in more detail with reference to FIG. 7 which shows the conventional LED module.

In FIG. 7, r represents the chip edge margin, and s represents the inter-chip distance. The following table shows the possible maximum inter-chip distance s for the chip edge margins of 4 μm and 8 μm when the resolution of the LED module is set to 400 DPI, 600 DPI, 1200 DPI and 2400 DPI.

| MAXIMUM INTER-CHIP DISTANCE s | | |
|---|---|---|
| | chip edge margin = 4 μm | chip edge margin = 8 μm |
| 400 DPI | 55.5 μm | 47.5 μm |
| 600 DPI | 34.3 μm | 26.3 μm |
| 1200 DPI | 13.0 μm | 5.0 μm |
| 2400 DPI | 2.5 μm | unable |

It is readily understood from the above table that as the resolution of the LED module is increased, the maximum possible inter-chip distanced is reduced. It is possible to mark each chip with an alignment mark and optically arrange each chip at a predetermined position while monitoring the mark. However, this technique also has a limitation in positioning of the chips.

Accordingly, as the light emitting elements of the LED module are arranged in higher density (as the resolution of the LED module increases) as described above, the probability increases that the arrangement of the neighboring chips will be disturbed or the neighboring chips will be damaged when a chip is disposed at a predetermined position or a defective chip is removed. Likewise, when a new chip is die-bonded to a portion of the board from which a defective chip has been removed, the probability that the arrangement of the neighboring chips will be disturbed or the neighboring chips will be damaged is also increased.

SUMMARY OF THE INVENTION

Therefore, the present invention has an object to provide a light emitting element module on which can readily and quickly be performed a process for arranging a chip at a predetermined position and on which can be performed a process for replacing a defective chip with a new chip even when the light emitting elements are arranged in high density (for example, 400 to 2400 DPI) in each chip of the light emitting element module (for example, LED module).

Furthermore, the present invention has another object to provide a light emitting element module and chips used for the light emitting element module, which can effectively prevent the printing characteristics from being deteriorated. This occurs due to leakage of the light from the chip edge side surface even when the array of the light emitting elements of the light emitting element module is highly dense. This light emitting element module and chips used for the light emitting element module allows the margin of the inter-chip distance to be large.

In order to attain the above objects, according to a first aspect of the present invention, a light emitting element module having plural chips arranged on a board is provided, with each chip having plural light emitting elements. The plural light emitting elements are arranged at an upper side of each chip so as to be displaced from the center line of the chip to one side surface of the chip (this one side surface is hereinafter referred to as "first side surface"). That is, the light emitting elements are located in the vicinity of the first side surface of the chip, and also arranged along the first side surface of the chip. Also, the plural chips are arranged on the board so that at least two neighboring chips are displaced (offset) from each other to the opposite sides (right and left sides) with respect to the alignment of the light emitting elements thereof (i.e., the chips are in a staggered arrangement).

Therefore, according to the light emitting element module as described above, the plural chips are arranged such that the light emitting elements of all the chips form one arrangement line (i.e., the light emitting elements are arranged in straight alignment with one another). At least two neighboring chips are displaced from each other to the opposite sides (right and left sides) with respect to the straight alignment of the light emitting elements so that the facing side surface of the neighboring chips are partially overlapped with each other in the alignment direction of the light emitting elements.

Irrespective of the displaced arrangement of the neighboring chips, the light emitting elements of the chips are straightforward aligned with one another to form substantially one arrangement line. Therefore, the light emitting element module can implement a high-precision light emitting function. In addition, the neighboring chips are arranged so as to be displaced from each other at least one position in the alignment direction of the light emitting elements. In other words, there is provided at least one portion where the overlap area between the side surfaces of the neighboring chips is reduced, thereby enlarging the working space. The enlargement of the working space makes it possible to reduce the probability that the arrangement of neighboring chips is disturbed or neighboring chips are damaged when a chip is mounted at a predetermined position or a defective chip is replaced with a new one, even when the density of arrangement of the light emitting elements is increased. Accordingly, the process of mounting at a predetermined position a chip having light emitting elements arranged in high density, and the process of replacing a defective chip with a new chip can be readily and quickly performed.

In the present invention, it is sufficient to provide at least one position where the overlap area between the side surfaces of neighboring chips is reduced (i.e., at least two neighboring chips which are displaced from each other to the opposite directions). This is because even when there is provided only one position where the overlap area between the side surfaces of the neighboring chips is reduced, the provision of such a position can enlarge the working space by the amount corresponding to the reduced area. Consequently, the mounting process of chips and the replacement process of defective chips can be readily and quickly performed.

Here, the light emitting element module is defined as a module which is constructed by arranging plural chips each having plural, densely packed light emitting elements (i.e., light emitting element array) on a board. The light emitting element is defined as an element for emitting/detecting light in the vertical direction with respect to the upper side of the board. Further, the first side surface of the chip is one of the four side surfaces which define a chip having a rectangular shape in plan view, and it is one side surface of the chip along which the light emitting elements are located. Accordingly, when the planar shape of the chip is rectangular or parallelogrammatic, the first side surface of this chip corresponds to one of two longer sides of the chip.

In the present invention, the provision of the light emitting elements in the vicinity of the first side surface means that the location (position) at which the light emitting elements are disposed is nearer to the first side surface. More specifically, the provision of the light emitting elements in the vicinity of the first side surface means that the light emitting elements are not brought into contact with the first side surface (that is, the surfaces of the light emitting elements and the first side surface are not on the same plane). Also, the light emitting elements are disposed nearer (within a range) to the first side surface of the chip than the longitudinal center line of the chip (for example, located at 350 $\mu$m from the first side surface of the chip) when the chip (the length of the second side surface intersecting to the first side surface being, for example, 700 $\mu$m) is bisected along the arrangement line formed by the light emitting elements. In the light emitting element module of the present invention, considering as a margin the position (distance) at which the light emitting elements are disposed in relation to a side surface of the chip, it is preferable that the margin is set to a value in the range of about 1 to 100 $\mu$m, and optimally the margin is set to a value in the range of about 3 to 10 $\mu$m.

In the light emitting element module of the present invention, it is preferable that plural chips are disposed in a staggered arrangement. According to the staggered arrangement of the chips on the board, the respective chips are alternately displaced (offset) from one another to the opposite sides with respect to the longitudinal center line of the chips, so that constant regularity is established in the arrangement. The even-numbered chips are displaced (offset) to the one side surfaces therefore (for example, the first side surfaces), while the odd-numbered chips are displaced (offset) to the opposing side surfaces thereof (for example, the third side surfaces), so that the light emitting elements of each of the chips are arranged in a straight line on the board. Accordingly, the overlap area between the second side surface (or the fourth side surface) of the odd-numbered chip and the second side surface (or the fourth side surface) of the even-numbered chip adjacent thereto is reduced, thereby enlarging the working space. Since the arranged chips are alternately and regularly displaced from one another as described above, the probability that the arrangement of the neighboring chips is disturbed or the neighboring chips are damaged when a chip is disposed at a predetermined position or a defective chip is replaced with a new one can be reduced.

Furthermore, in the light emitting element module of the present invention, it is preferable that the respective light emitting elements form one arrangement line as a whole. It is also preferable that the first side surfaces of the odd-numbered chips from the edge of the chip alignment are located in one side area of the board with respect to the arrangement line, while the first side surfaces of the even-numbered chips from the edge of the chip alignment are located in the other side area of the board with respect to the arrangement line.

With the above-described construction of the light emitting element module, a more uniform arrangement line can be constructed by the light emitting element module. Therefore, when the light emitting element module as described above is applied to an LED printer head or the like, the light emitting element module exerts its print function with high precision. In addition, the overlap area between the second side surface (or the four side surface) of each odd-numbered chip and the fourth side surface (or the second side surface) of each even-numbered chip can be reduced, resulting in a larger working space.

Furthermore, in the light emitting element module of the present invention, it is preferable that the second side surface of the chip intersects the first side surface at an angle other than 90° (not at a right angle).

The shape of the chips of the light emitting element module as described above allows the margin (distance) between neighboring chips (between the odd-numbered chip from the edge of the chip alignment and the even-numbered chip from the edge of the chip alignment) to be increased.

Still further, in the light emitting element module of the present invention, it is preferable that the planar shape of each of the light emitting elements is substantially parallelogram-shaped (containing no rectangular shape).

The shape of the chips of the light emitting element module as described above allow the margin (distance) between neighboring chips (between the odd-numbered chip from the edge of the chip alignment and the even-numbered chip from the edge of the chip alignment) to be increased.

Still further, in the light emitting element module of the present invention, it is preferable that the planar shape of the chips is substantially parallelogram-shaped (containing no rectangle). The shape of the chips of the light emitting element module as described above allows the margin (distance) between neighboring chips (the odd-numbered chip and the even-numbered chip from the edge of the chip alignment) to be increased.

In addition, it is preferable that the planar shape of the light emitting elements of the chips is substantially parallelogram-shaped. The shape of the light emitting elements of the chips of the light emitting element module as described above allows the distance from the side surface (at the edge side of the chip) of a light emitting element located at the edge portion of a chip to the second side surface (or the fourth side surface) of the chip to be increased.

Further, in the light emitting element module of the present invention, the side surface of each chip and the side surface of each light emitting element are preferably substantially parallel to each other.

The side surface of each chip and the side surface of each light emitting element in the light emitting element module are matched with each other in shape as described above. This further increases the distance from the side surface (at the edge side of the chip) of a light emitting element located at the edge portion of a chip to the second side surface (or fourth side surface) of the chip.

In the light emitting element module of the present invention, the light emitting elements of the chips are preferably composed of LEDs (Light Emitting Diodes). This is because, although the LED is small in dimension, it has a large light emission amount, and thus it is suitable for the light emitting element module.

In the light emitting element module of the present invention, it is preferable that each of the light emitting elements of the chips has both a light emitting function (i.e., acts as a light emitter) and a photosensing (light receiving) function (i.e., acts as a photodetector).

If each light emitting element has both the light emitting function and the photosensing function as described above, then when it is applied to an LED printer head or the like, a reading/writing head is provided. This head will allow for both a process for mounting a chip having light emitting elements and a repairing process for repairing a chip, which can both be readily performed.

Further, in the light emitting element module of the present invention, each of the light emitting elements of the chips preferably performs the switching operation between the light emitting function and the photosensing function thereof by changing the application direction of a bias voltage to the light emitting element (i.e., by selectively applying the bias voltage forwardly or reversely).

According to the construction of the light emitting elements of the chips as described above, both the light emitting function and the photosensing function can be readily provided to the light emitting element module of the present invention. No special device is needed and the light emitting element module can be designed in compact size.

Still further, the light emitting element module of the present invention is preferably used as a light source for an LED printer head. When the light emitting element module of the present invention is used as a light source for an LED printer head, the light emitting elements can be arranged in high density and the chips having the high-density arrangement of light emitting elements can be readily mounted on the board. As a result, the manufacturing process of LED printer heads is facilitated. In addition, there can be reduced the probability that the arrangement of adjacent chips is disturbed or the adjacent chips are damaged even when a defective chip is replaced with a new one or is repaired. Accordingly, chip mount process for mounting a chip at a predetermined position and the chip replacement process for replacing a defective chip with a new one in a manufacturing or repairing process of a light source of a high-density LED printer head can be readily and quickly performed.

The light emitting element module of the present invention is preferably used as a print head or a reading/writing head for an LED printer head. The light emitting element module of the present invention is suitably used as a printing head or a reading/writing head for an LED printer head because the light emitting elements can be designed in high density, the manufacturing process of the light emitting element module itself is easy, and each of the light emitting elements can be provided with both the light emitting function and the photosensing function.

According to a second aspect of the present invention, a chip having plural light emitting elements has one side surface of the chip which is referred to as a first side surface and another side surface of the chip which intersects the first side surface and which is referred to as a second side surface. The light emitting elements of the chip are provided in the vicinity of the first side surface of the chip so as to be located aside the first side surface of the chip, and the second side surface of the chip intersects the first side surface thereof at an angle other than 90°.

A plurality of chips thus constructed are arranged so as to be alternately displaced from one another. For example, they are disposed in a staggered arrangement so that the highly densely packed light emitting elements form one arrangement line (i.e., the light emitting elements are arranged in a straight alignment with one another), and the odd-numbered chips and the even-numbered chips from the edge of the chip alignment are arranged so that the facing surfaces of these chips are partially overlapped in the chip alignment direction. A light emitting element module which has an enlarged working space and is provided with highly densely packed light emitting elements can be constructed by using the above chips. Accordingly, it is possible to reduce the probability that when a chip is mounted at a predetermined position or a defective chip is replaced with a new one, the arrangement of the adjacent chips will be disturbed or the adjacent chips will be damaged. Thus, the process for mounting a chip at a predetermined position and the chip replacement process for replacing a defective chip with a new one can be readily and quickly performed.

It is preferable that the chip of the present invention is designed to be substantially parallelogram-shaped (containing no rectangle) in plan view. By specifying the shape of the chip as described above, under the same condition that the chip edge margin is constant, the inter-chip distance is longer than the case where the second side surface of each chip intersects the first side surface at a right angle. As the inter-chip distance is increased, the mount degree of each chip on the board is enhanced, resulting in facilitation of the chip mount process and the chip replacement process.

Furthermore, with the chip of the present invention, it is preferable that the light emitting elements of the chip are designed to be substantially parallelogram-shaped (containing no rectangular shape) in plan view. The shape of the light emitting elements of the chip as described above allows the distance from the side surface (closest to the edge side of the chip) of the light emitting element located at the edge of each chip to the second side surface (or fourth side surface) of the chip to be increased.

By matching the shapes of the side surfaces of the chips and the side surfaces of the light emitting elements as described above, the distance from the side surface (at the edge side of the chip) of the light emitting element located at the edge portion of each chip to the second side surface (or fourth side surface) of the chip can be increased.

Still further, it is preferable that each light emitting element of the chip is provided with both the light emitting function and the photosensing (photodetecting) function. In this case, when the chip is applied to an LED printer head or the like, a reading and writing head for which the manufacturing process and the repairing process can be readily performed is provided.

It is preferable that each light emitting element of the chip perform the switching operation between the light emitting function and the photosensing function by changing the bias-voltage application direction in the chip. By constructing the light emitting elements of the chip as described above, the light emitting element module of the present invention can be readily provided with both the light emitting function and the photosensing function with no special device, and the light emitting element module can also be miniaturized.

BRIEF DESCRIPTION OF THE DRAWINGS

The foregoing and other objects, features and advantages of the present invention will be better understood from the following description taken in connection with the accompanying drawings; in which:

FIGS. 4(A) and 4(B) are diagrams showing an LED module according to a second embodiment of the present invention;

DETAILED DESCRIPTION OF THE PREFERRED EMBODIMENTS

Figure 1:
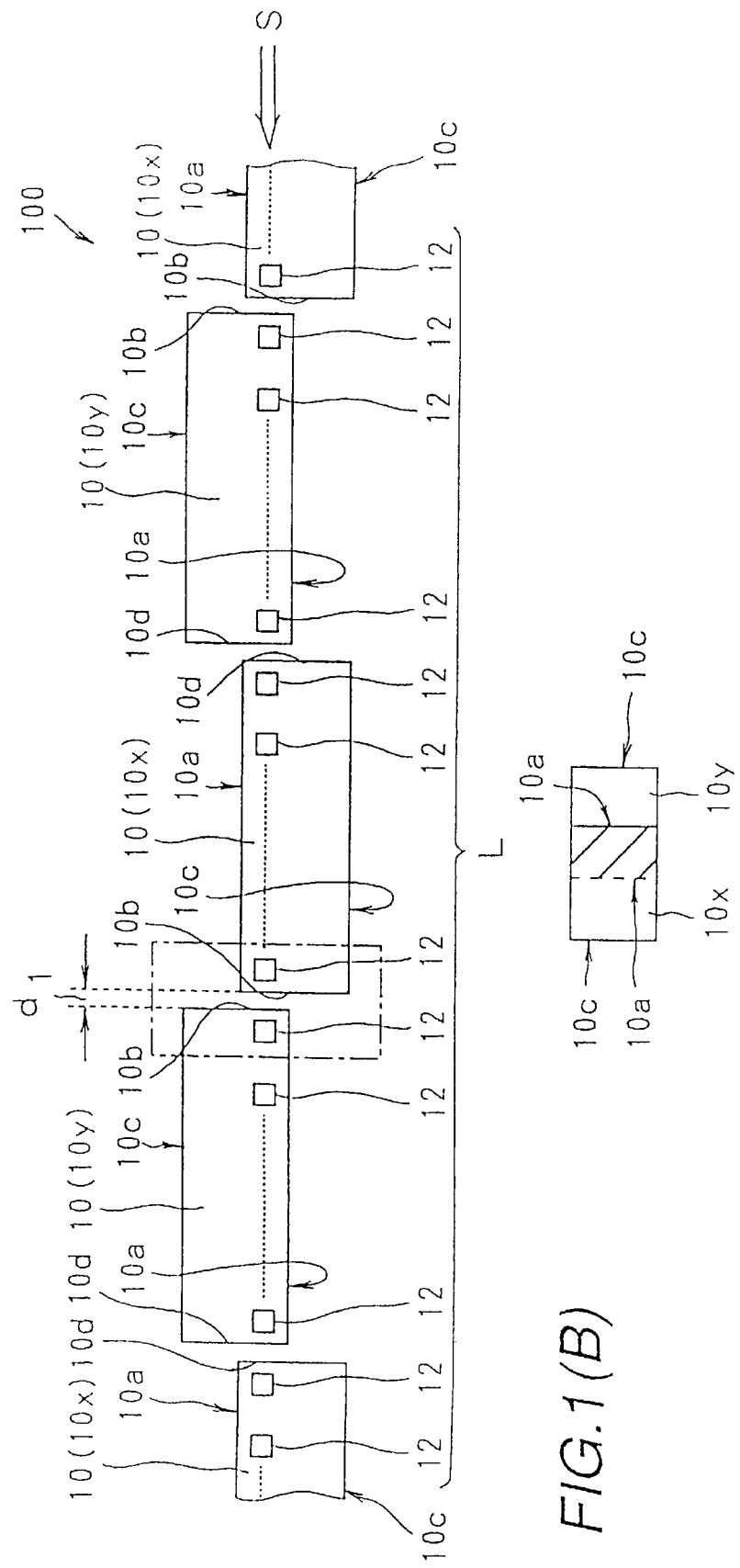
FIGS. 1(A) and 1(B) are diagrams showing an LED module according to a first embodiment of the present invention.

Preferred embodiments according to the present invention will be described hereunder in detail with reference to the accompanying drawings.

In the accompanying drawings, the respective constituent elements of the present invention are illustrated schematically to the extent that the shape, the size and the arrangement relationship thereof are understandable. Accordingly, the present invention is not limited to the illustration of the drawings unless otherwise specified. Further, the same or similar elements in the drawings are represented by the same reference numerals, and the duplicative description thereof is omitted.

In the following embodiments, an LED module (LED printer head) which is one type of light emitting element modules will be typically represented, and an embodiment of a chip will be also described together in a second embodiment.

<First Embodiment>

FIGS. 1(A) and 1(B), FIG. 2 and FIG. 3 show an LED module (LED printer head) of a first embodiment according to the present invention.

Figure 2:
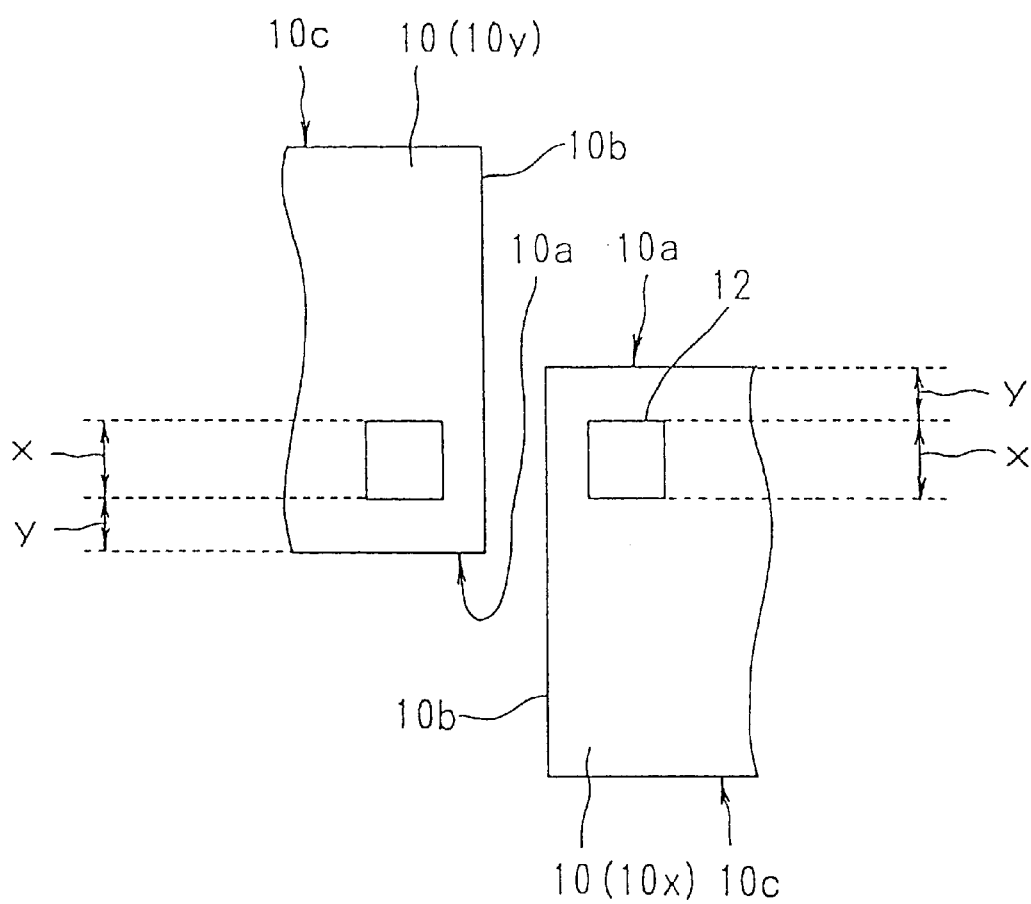
FIG. 2 is an enlarged view of a part of the LED module according to the first embodiment of the present invention.
Figure 3:
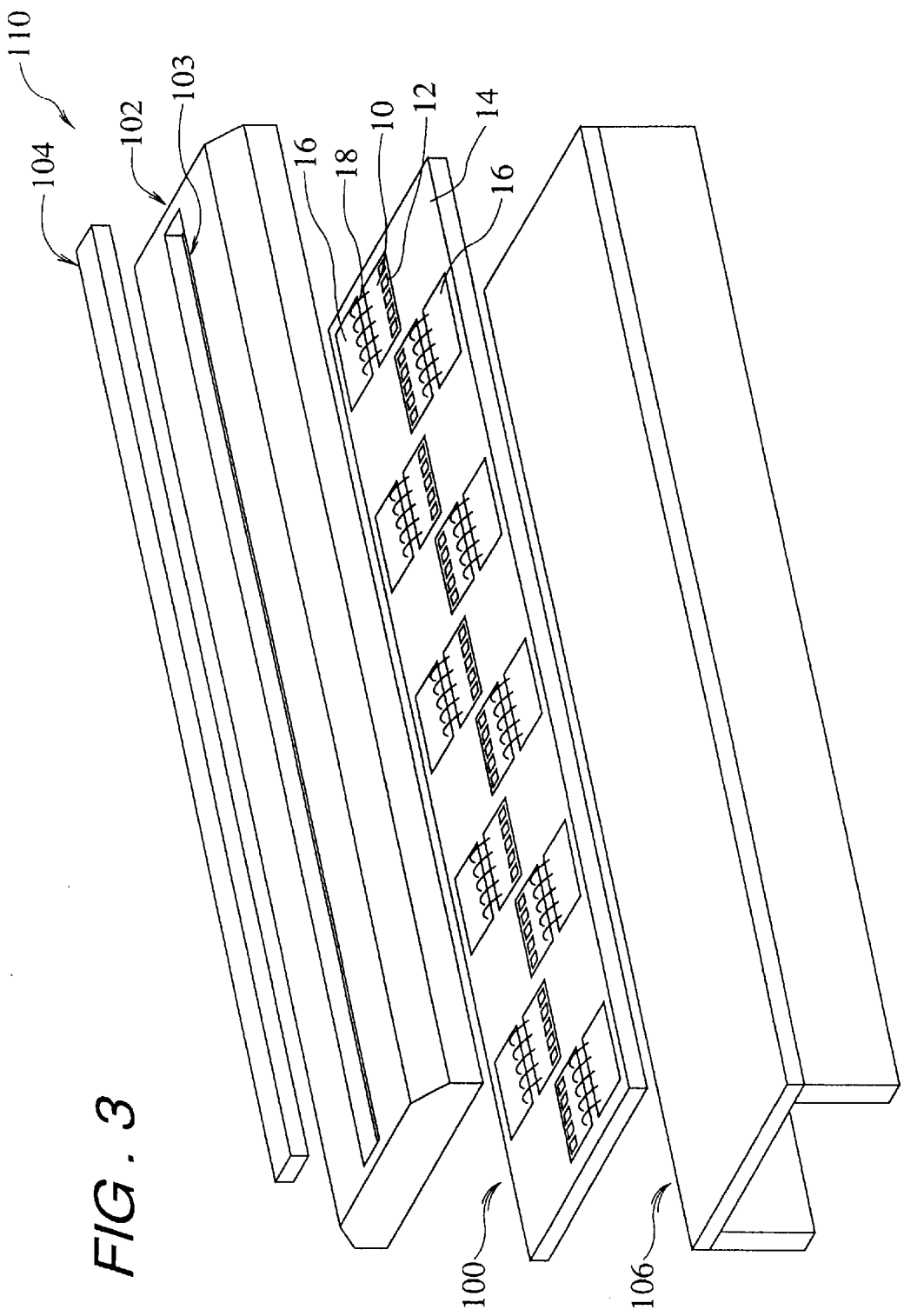
FIG. 3 is an exploded view showing an LED printer head when the LED module of the first embodiment of the present invention is used for the LED printer head.

FIG. 1(A) is a plan view showing the LED module, and also shows a chip serving as a part of the LED module and the periphery thereof, and FIG. 1(B) is a side view showing the LED module which is taken in the direction of S in FIG. 1(A). FIG. 2 is an enlarged view showing a part which is surrounded by a one-dotted broken line in FIG. 1(A), and FIG. 3 is an exploded view when the LED module shown in FIG. 1 and FIG. 2 is used as a part of an LED printer head. In FIGS. 1 and 2, electrodes, a board, etc. are omitted from the illustration of the LED module.

In this embodiment, a generally-used rectangular chip (for example, 700 μm in longitudinal direction (the length of the second and the fourth side surfaces), 8000 μm in lateral direction (the length of the first and third side surfaces), 300 μm in height) is used.

As shown in FIG. 1(A), each chip 10 is provided with plural light emitting elements 12 which are arrayed in high density. All the light emit emitting elements 12 are arranged aside the first side surfaces 10a of the chips so as to be in straight alignment with one another along the first side surfaces 10a. Each chip 10 comprises the first side surface 10a, the second side surface 10b, the third side surface 10c and the fourth side surface 10d.

As in the prior art, one side surface of each chip along which the light emitting elements 12 are located is referred to as a first side surface 10a. Another side surface of each chip, which intersects to the first side surface 10a, is referred to as a second side surface 10b. Another side surface of each chip, which is opposed to the first side surface 10a, is referred to as a third side surface 10c. The residual side surface of each chip, which is opposed to the second side surface 10b, is referred to as a fourth side surface 10d.

As shown in FIG. 1(A), the chips 10 are arranged (disposed) so that the distance between the neighboring chips 10 (the inter-chip distance) $d_1$ is fixed. In addition, the chips 10 are arranged (disposed) on the board so that the neighboring chips are alternately displaced (offset) from each other (i.e., the chips are disposed in a staggered arrangement) and the plural light emitting elements 12 provided to the respective chips 10 are aligned with one another to form an arrangement line L (a row of the light emitting elements 12).

In this embodiment, one group of chips which contain the leftmost chip, and subsequently, every other chip from the left edge of the chip alignment, is set as odd-numbered chips 10x as shown in FIG. 1(A). The other group contains the second chip from the left side and, subsequently, every other chip, and is set as even-numbered chips 10y as shown in FIG. 1(B). Accordingly, the first side surfaces 10a of the odd-numbered chips 10x are located in one side area with respect to the arrangement line L of the light emitting elements 12 (in FIG. 1(A), the upper side area of the arrangement line L of the light emitting elements), and the first side surfaces 10a of the even-numbered chips 10y are located in the other side area with respect to the arrangement line L of the light emitting elements 12 (in FIG. 1(A), the lower side area of the arrangement line L of the light emitting elements).

When the chips 10 are arranged as described above, the oddnumbered chips 10x and the even-numbered chips 10y are arranged so as to be offset in the opposite directions with respect to the arrangement line L of the light emitting elements 12. That is, the direction from the first side surface 10a to the third side surface 10c is opposite between the odd-numbered chips 10x and the even-numbered chips 10y. Further, when the side surface of the LED module 100 is viewed along the extension line of the arrangement line L of the light emitting elements 12, each odd-numbered chip 10x and each even-numbered chip 10y are partially overlapped as shown in FIG. 1(B) (the overlap area between the odd-numbered chip 10x and the even-numbered chip 10y is hatched in FIG. 1(B)). The chips are partially overlapped between the first side surface 10a of each odd-numbered chip 10x and the first side surface 10a of each even-numbered chip 10y.

The reduction of the overlap area between the neighboring chips as described above enables the working space to be enlarged. Accordingly, overlap portions can be eliminated which will suppress the disturbance of the arrangement of the neighboring chips or the damage of the neighboring chips, even when a chip is mounted at a predetermined position on a board or a defective chip is replaced with a new one. Thus, the process for mounting a chip at a predetermined position and the chip replacement process for replacing a defective chip with a new one can be readily and quickly performed.

As described above, the chip has a rectangular pallelepiped body having the size of 700 μm in longitudinal direction, 8000 μm in lateral direction and 300 μm in height. The light emitting elements are linearly aligned with one another along the side surface (first side surface 10a, which is 8000 μm×300 μm in dimension), at the upper side of the chip having the size of 700 μm×8000 μm.

In the above case, the light emitting elements are linearly aligned with one another. However, the light emitting elements may be arranged on two or more rows. This arrangement is preferable because the area of the light emitting elements is larger as a whole.

It is assumed in this embodiment that each light emitting element 12 is a square whose side length x is equal to 8 μm as shown in FIG. 2, and the distance y from the first side surface 10a to each light emitting element 12 is 6 μm. Therefore, when viewing the side surface of the LED module along the extension line of the arrangement line L of the light emitting elements 12 (that is, when viewing the side surface of the LED module 100 from the direction of S in FIG. 1.(A)), the area of the overlap portion between the odd-numbered chip 10x and the even-numbered chip 10y is equal to (6 μm+8 μm+6 μm)×300 μm=6000 μm².

On the other hand, when the chips are disposed in a linear arrangement as found in the prior art, the area of the overlap portion between the odd-numbered chip 10x and the even-numbered chip 10y is equal to 700 μm×300 μm=21000 μm².

Accordingly, when the respective chips are arranged as described in the above embodiment, it is understood that the overlap area between the neighboring chips can be reduced to ⅓₅ of that of the prior art in which the chips are arranged so that the side surfaces thereof are overlapped over the full width thereof.

The ratio of the areas of the overlap portion when the chips are staggered to the overlap portion when the side surfaces are fully overlapped is preferably set to 50% or less at maximum, more preferably 25% or less, and optimally 5% or less.

If the overlap area between the neighboring chips is within the above range, the working space can be enlarged. Accordingly, even when the light emitting elements are arranged in a high density in the LED module 100, the chips 10 can be readily and quickly arranged on the board 14 by a die-bonding technique or the like. The chip mount process and the chip replacing (the chip repairing) process can also be readily and quickly performed.

FIG. 3 is an exploded view showing an LED printer head 110 when the LED module 100 is used as a part of the LED printer head 110 as shown in FIGS. 1 and 2.

The LED printer head 110 comprises a support portion 106, an LED module 100, a rod lens array holder 102 and a rod lens array 104 from the lower side. The support portion 106 serves to mechanically hold the LED module 100, and also serves as a heat sink for radiating heat which occurs in the LED module 100. The rod lens array holder 102 is directly provided at the upper side of the LED module 100 to accurately position the rod lens array 104 which is mounted in the opening 103 of the holder 102. The rod lens array 104 serves to efficiently focus an LED image onto a photosensitive member.

As described above, the LED module 100 uses the chips each having the light emitting elements 12, which are arranged at the upper side of the chip and along the first side surface 10a of the chip 10. In addition, a plurality of these chips 10 are arranged on the board 14 while alternately displaced (offset) from one another (in a staggered arrangement).

Further, an IC driver 16 for driving a chip is provided on the board 14 of the LED module 100 in association with each chip. Each light emitting element 12 on the upper side of each chip 10 is electrically connected to each terminal of the IC driver 16 by a bonding wire 18. Accordingly, in the LED printer head 110 thus constructed, each IC driver 16 controls each light emitting element 12 to exhibit its light emitting function, and data are printed on a photosensitive member through the rod lens array 104.

According to the LED module 100 which constitutes a part of the LED printer head 110, the overlap area between the neighboring chips 10 is reduced, and the working space is enlarged. Accordingly, when the LED printer head 110 is constructed, a highly dense (for example, 400 to 2400 DPI) chip 10 can be readily and quickly mounted at a predetermined position. In addition, even when a defective chip occurs due to use of the LED printer head 110, the chip can be readily and quickly replaced with a new one.

<Second Embodiment>

Figure 5:
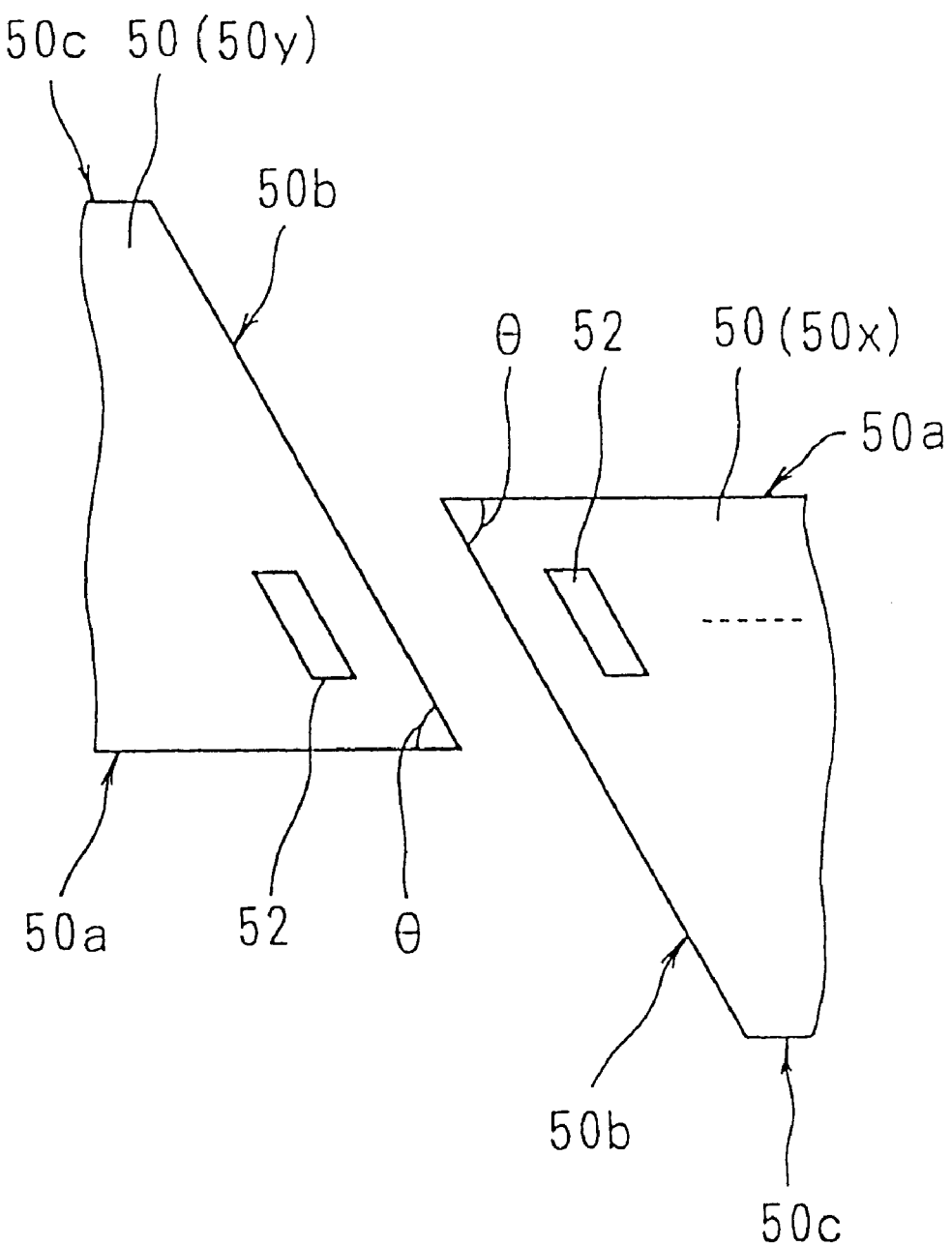
FIG. 5 is an enlarged view showing a part of the LED module of the second embodiment shown in FIGS. 4(A) and 4(B)
Figure 6:
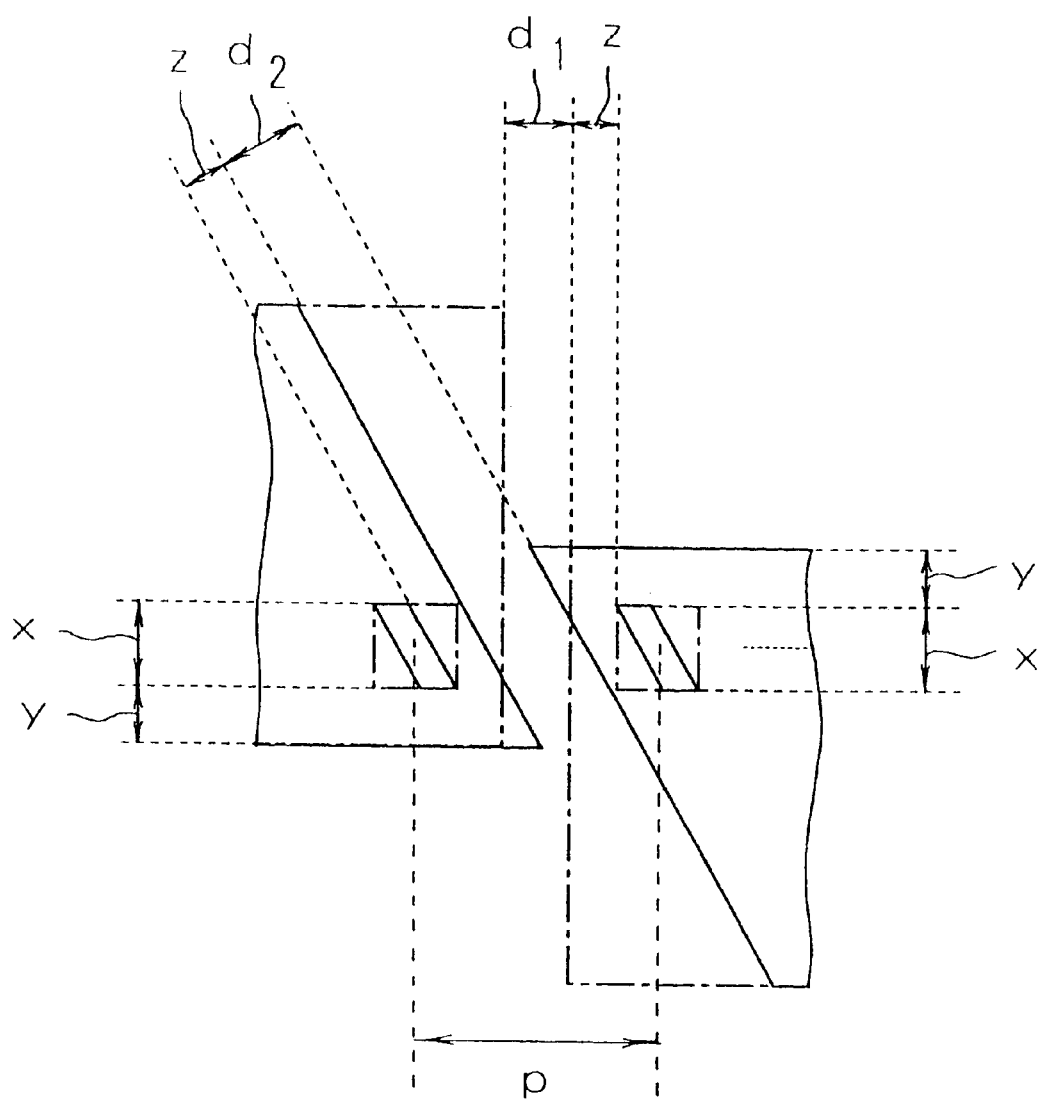
FIG. 6 is a schematic diagram showing the comparison between the inter-chip distance of the LED module of the second embodiment and the inter-chip distance of the LED module of the first embodiment according to the present invention.
Figure 7:
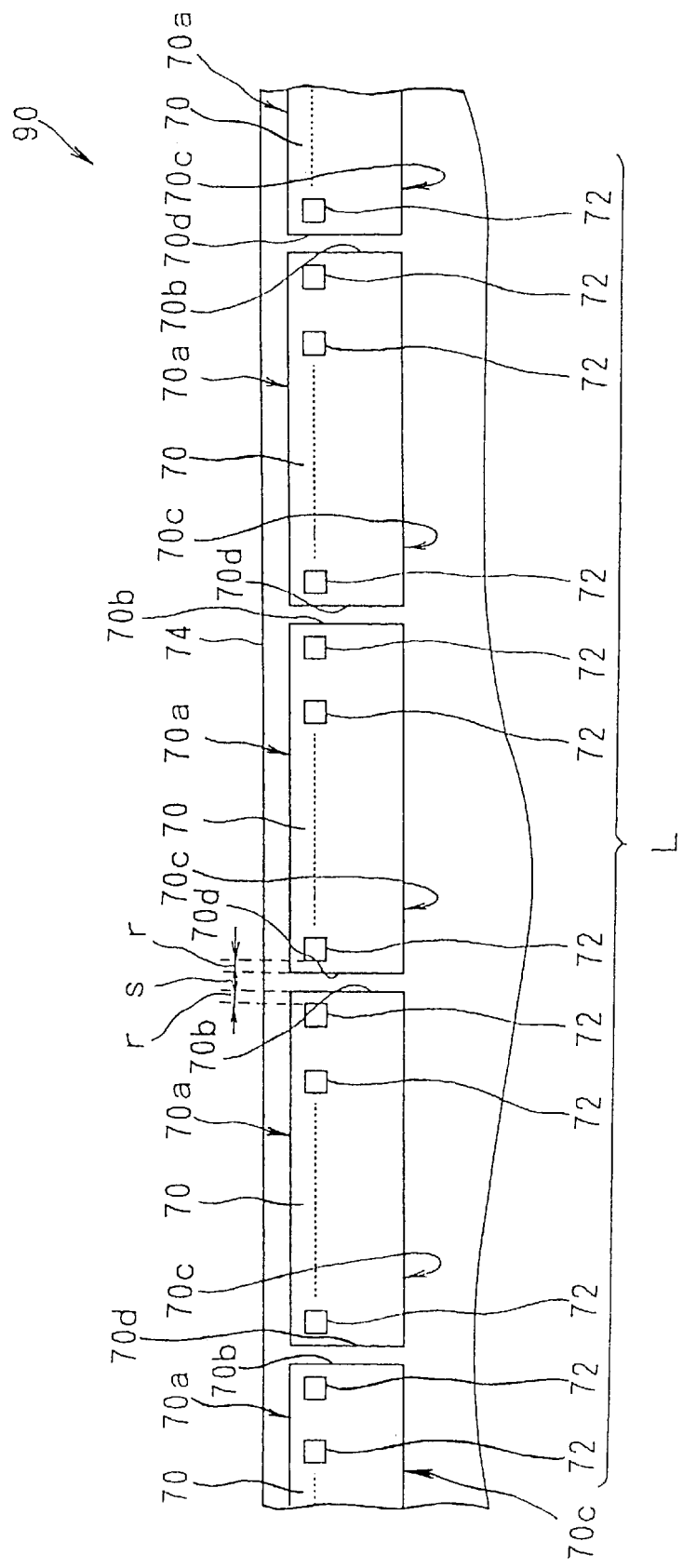
FIG. 7 is a plan view which schematically shows a general LED module.

FIGS. 4(A) and 4(B), FIG. 5 and FIG. 6 show an LED module according to a second embodiment of the present invention. FIG. 4(A) is a schematic plan view showing the LED module, and shows a chip constituting a part of the LED module and the periphery thereof. FIG. 4(B) is a side view showing the LED module, which is viewed from the direction of S in FIG. 4(A). FIG. 5 is an enlarged view showing a part surrounded by a one-dotted broken line in FIG. 4(A). FIG. 6 is a schematic diagram to show the comparison result between the inter-chip distance of the LED module of the second embodiment and the inter-chip distance of the LED module of the first embodiment. In the figures, electrodes, a board, etc. are omitted from the illustration.

As shown in FIG. 4(A), each chip 50 is provided with plural light emitting elements 52 which are arranged in high density, and the light emitting elements 52 are located along to the first side surfaces 50a of all the chips 50 and linearly aligned with one another along the first side surfaces 50a. The second side surface 50b of each chip 50, which intersects the first side surface of the chip, faces the adjacent chip and intersects to the first side surface 50a at an angle other than 90°. Accordingly, the second side surface 50b serves as the chip edge which faces the adjacent chip.

In the case where the chip edge margin z is set to 4 $\mu$m and the dot pitch p is set to 21 $\mu$m, the inter-chip distance is maximum second side surface 50b when the intersection angle $\theta$ between the second side surface 50b and the first side surface 50a is equal to 60°. For purposes of convenience, the second embodiment will be described on the assumption that the second side surface 50b intersects to the first side surface 50a at an angle $\theta$ of 60°.

Further, as shown in FIG. 5, the light emitting element which is located nearest to the second side surface 50b of each chip 50 (hereinafter referred to as "chip edge light emitting element") is designed in a parallelogram shape in plan view. The outline (contour) of the chip edge light emitting element 52 at the second side surface 50b side is parallel to the second side surface 50b.

In the second embodiment, the planar shape of the chip edge light emitting element 52 is set to be parallelogram-shaped (excluding rectangle). However, it is not limited to the parallelogram shape. The planar shape may be triangular, trapezoidal, semi-circular or the like, as long as the second side surface (outline) of the chip edge light emitting element is parallel to the second side surface (outline) of the chip. When the planar shape of the light emitting element is a shape other than a square or a rectangle, the minimum square or rectangle in which the light emitting element is accommodated (it is assumed that one side of the square or the rectangle must be parallel to the first side surface is assumed) and the dot pitch from the intersection point between the diagonal lines of the square or the rectangle to the adjacent light emitting element is measured.

As shown in FIG. 4(A), the chips 50 are disposed on the board 54 so that the inter-chip distance $d_2$ is constant, and also these chips 50 are arranged on the board so that the arrangement line L (the array of the light emitting elements 52) is formed by plural light emitting elements 52 which are provided in the chips 50 (i.e., the plural light emitting elements are linearly aligned with one another to form the arrangement line L). In this case, the leftmost chip and, subsequently, every other chip from the leftmost chip are set as odd-numbered chips 50x, while the second chip from the left edge of the chip alignment and, subsequently, every other chip are set as even-numbered chips 50y.

Accordingly, the first side surfaces 50a of the odd-numbered chips 50x are located in one side area with respect to the arrangement line L of the light emitting elements 52 on the board (print circuit board) 54 (the upper side area of the arrangement line L of the light emitting elements 52 in FIG. 4(A)). The first side surfaces 50a of the even-numbered chips 50y are located in the other side area with respect to the arrangement line L of the light emitting element 52 on the board 54 (the lower side area of the arrangement line L, of the light emitting elements 52 in FIG. 4(A)).

In the case where the respective chips 50 are arranged as described above, each odd-numbered chip 50x and each even-numbered chip 50y are partially overlapped with each other when the side surface of the LED module 60 is viewed along the extension line of the arrangement line L of the light emitting elements 50 (in FIG. 4(B), the overlap area between the odd-numbered chip 50x and the even-numbered chip 50y is hatched). This arrangement is readily understandable from the enlarged view (FIG. 50 of a portion which is surrounded by one-dotted broken line in FIG. 4(A). With respect to the odd-numbered chip 50x and the even-numbered chip 50y which are adjacent to each other, as shown in FIG. 5, the second side surface 50b of the odd-numbered chip 50x and the second side surface 50b of the even-numbered chip 50y are partially overlapped. In this case, the overlap area between the neighboring chips is about 44% of the total area of the chip second side surface.

If the overlap area between the neighboring chips is reduced as described above, portions at which the arrangement of the neighboring chips may be disturbed or the neighboring chips may be damaged when a chip is mounted at a predetermined position or a defective chip is replaced with a new one can be removed. Accordingly, the process for mounting a chip at a predetermined position and the process for replacing a defective chip with a new chip can be readily and quickly performed.

FIG. 6 shows the peripheries of the chip edges of two chips which are adjacent to each other in the LED module of the second embodiment. This figure also illustrates, with one dotted broken line, the LED) module 60 of the second embodiment while superposing the LED module 60 of the second embodiment with the LED module 100 of the first embodiment under the condition of the same distance y from the first side surface 50$a$ to the light emitting elements 52, the same chip edge margin z, and the same dot pitch p. That is, the illustrations of FIGS. 2 and 5 are shown while overlapping each other, and FIG. 2 is illustrated by one-dotted broken line.

FIG. 6 shows the case where the distance y from the first side surface to the light emitting elements is 6 µm, the chip edge margin z is 4 µm, and the dot pitch R is 21 µm. In the case of the LED module 100 of the first embodiment, the light emitting element is designed as a square having one side of 8 µm, and the inter-chip distance d is 5 µm. On the other hand, in the case of the LED module 60 of the second embodiment, each side x of the minimum square in which the light emitting element is accommodated is 8 µm. Since the second side surface 50$b$ intersects the first side surface 50$a$ at an angle θ of 60° in the LED module 60 of the second embodiment, the inter-chip distance $d_2$ is equal to 7.2 µm.

Accordingly, as in the case of the above embodiment, when the intersection angle θ between the second side surface 50$b$ and the first side surface 50$a$ is 60°, and the side surface of the chip edge light emitting element 52$a$ corresponding to the second side surface 50$b$ of the chip 50 is parallel to the second side surface 50$b$ of the chip, the inter-chip distance is increased by about 1.4 times as compared with the first embodiment in that embodiment the side surface of the chip which faces the adjacent chip intersects the first side surface at a right angle.

Accordingly, in spite of the high density arrangement of the plural light emitting elements 52 (for example, 400 to 2400 DPI), the risk of contacting a neighboring chip is reduced. The working space is enlarged, and both the process for mounting a chip at a predetermined position and the chip replacement process for replacing a defective chip with a new one can be readily and quickly performed.

As in the case of the LED module 100 of the first embodiment, the LED module 60 of the second embodiment is also usable as a part of an LED printer head. As described in the first embodiment (see FIG. 3), the LED printer head can be constructed by the LED module 60 of the second embodiment, the support member, the rod lens array holder and the rod lens array.

Accordingly, in the LED printer head which uses the LED module 60 of the second embodiment as a part thereof, each IC driver controls each light emitting element to exhibit its light emitting function, whereby print can be performed on a photosensitive member through the rod lens array.

It is apparent that the present invention is not limited to the above-described first and second embodiments. For example, each of the above-described embodiments relates to an LED module which is mainly applied to an LED print head or the like. However, the present invention may be applied to an image sensor or the like which is constructed by arranging chips on a board, each of which include plural PDs (photodiodes) as light emitting elements.

Furthermore, in the present invention, the light emitting elements are controlled to selectively exhibit either the light emitting function or the photosensing function by switching the application direction of a bias voltage to the chips. Consequently, the LED module can be applied to not only an LED printer head for print (exhibiting a print function), but also a reading head for reading information from a printed medium or the like, or a reading/writing LED print head.

As described above, the light emitting element module is constructed by arranging chips on a board, each of which comprises plural light emitting elements. When one of the side surfaces of each chip is expressed as a first side surface, the respective light emitting elements are provided in each chip so as to be located aside the first side surface of the chip, and the light emitting elements are arranged along the first side surface of the chip. In addition, the respective chips are arranged on the board so that one arrangement line is formed by the light emitting elements of all the chips. The first side surfaces of the odd-numbered chips are located in one side area with respect to the arrangement line of the light emitting elements, while the first side surfaces of the even numbered-chips are located in the other side area with respect to the arrangement line of the light emitting elements.

According to the light emitting element module thus constructed, each odd-numbered chip and each even-numbered chip are partially overlapped with each other when viewing the side surface of the light emitting element module along the extension line of the arrangement line of the light emitting elements. That is, the odd-numbered chip and the even-numbered chip are overlapped only between the first side surface of the odd-numbered chip and the first side surface of the even-numbered chip, and the neighboring chips are aligned so that the side surfaces of the chips are partially confronted to each other (i.e., they are confronted to each other only at a narrow portion extending from the alignment of the light emitting elements to the first side surface).

Accordingly, the reduction of the overlap area between the neighboring chips as described above makes it possible to reduce the probability that when a chip is mounted at a predetermined position on the board or a defective chip is replaced with a new one, the arrangement of the adjacent chips will be disturbed or the adjacent chips will be damaged. That is, the process for mounting, at a predetermined position, a chip having light emitting elements which are arranged in high density, and the process for replacing a defective chip with a new one can be readily and quickly performed.

Furthermore, in the light emitting element module as described above, the confronting second side surfaces of the adjacent chips are set to intersect the first side surfaces thereof at an angle other than 90° (not at the right angle). In addition, the light emitting element (chip edge light emitting element) which is nearest to the second side surface of each chip is set to be parallel to the second side surface. Accordingly, under the condition that the chip edge margin is fixed, the inter-chip distance is increased to a larger value as compared with the case where the second side surfaces of the adjacent chips which are confronted to each other intersect the first side surfaces thereof at a right angle. As the inter-chip distance is increased, the working space is enlarged, and the freedom of the chip mount on the board is enhanced. A chip having plural light emitting elements which are arranged in high density can be easily arranged with high precision.

We claim:

1. A light emitting element module comprising:
    a board;
    a plurality of chips positioned on said board, each of said chips having a first side, a second side, a third side located opposite said first side, and a fourth side located opposite said second side; and a plurality of light emitting elements positioned on an upper surface of said chips;

each of said chips having a substantially parallelogram shape, wherein said first side of said chip intersects said second side of said chip at an oblique angle;

said light emitting elements being linearly arranged on said chips, such that said light emitting elements form a line along said first side of said chip;

said line of said light emitting elements being located closer to said first side of said chip than to said third side of said chip;

said chips being positioned on said board such that each of said lines of said light emitting elements on each of said chips is aligned to form a line of said light emitting elements across said board;

said chips being positioned on said board in a staggered arrangement, wherein each of said first sides of said chips is alternately positioned with respect to said line of said light emitting elements across said board;

each of said chips having a first light emitting element positioned closest to said second side of said chip, wherein said first light emitting element has an outer side that is closest to said second side of said chip, wherein said outer side of said first light emitting element is parallel to said second side of said chip;

each of said chips having a last light emitting element positioned closest to said fourth side of said chip, wherein said last light emitting element has an outer side that is closest to said fourth side of said chip, wherein said outer side of said last light emitting element is parallel to said fourth side of said chip.

2. The module of claim 1, wherein each of said light emitting elements has a substantially parallelogram shape.

3. The module of claim 2, wherein a first side surface of said light emitting element intersects an adjacent second side surface of said light emitting element at an oblique angle.

4. The module of claim 1, wherein each of said light emitting elements comprises a light emitting diode.

5. The module of claim 1, wherein each of said light emitting elements has a light emitting function and a photosensing function.

6. The module of claim 5, wherein each of said light emitting elements selectively exhibits either said light emitting function or said photosensing function by switching an application direction of a bias voltage to said chips.

7. A print head comprising:

a support portion;

a board, wherein said board is supported by said support portion;

a plurality of chips positioned on said board, each of said chips having a first side, a second side, a third side located opposite said first side, and a fourth side located opposite said second side; and a plurality of light emitting elements positioned on an upper surface of said chips;

each of said chips having a substantially parallelogram shape, wherein said first side of said chip intersects said second side of said chip at an oblique angle;

said light emitting elements being arranged linearly on said chips, such that said light emitting elements form a line along said first side of said chip;

said line of said light emitting elements being located closer to said first side of said chip than to said third side of said chip;

said chips being positioned on said board such that each of said lines of said light emitting elements on each of said chips is aligned to form a line of said light emitting elements across said board;

said chips being positioned on said board in a staggered arrangement, wherein each of said first sides of said chips is alternately positioned with respect to said line of said light emitting elements across said board;

each of said chips having a first light emitting element positioned closest to said second side of said chip, wherein said first light emitting element has an outer side that is closest to said second side of said chip, wherein said outer side of said first light emitting element is parallel to said second side of said chip;

each of said chips having a last light emitting element positioned closest to said fourth side of said chip, wherein said last light emitting element has an outer side that is closest to said fourth side of said chip, wherein said outer side of said last light emitting element is parallel to said fourth side of said chip.

8. The print head of claim 7, wherein each of said light emitting elements has a substantially parallelogram shape.

9. The print head of claim 8, wherein said first side of said light emitting element intersects said second side of said light emitting element at an oblique angle.

10. The print head of claim 7, wherein each of said light emitting elements comprises a light emitting diode.

11. The print head of claim 7, wherein each of said light emitting elements has both a light emitting function and a photosensing function.

12. The print head of claim 11, wherein each of said light emitting elements selectively exhibits either said light emitting function or said photosensing function by switching an application direction of a bias voltage to said chips.

13. The print head of claim 7, wherein said print head has both a printing function and a reading/writing function.

14. The print head of claim 7, further comprising a rod lens array supported above said light emitting elements by a rod lens array holder.

15. A light emitting element module comprising:

a board;

a plurality of chips positioned on said board, each of said chips having a first side, a second side, a third side located opposite said first side, and a fourth side located opposite said second side; and each of said chips having a plurality of light emitting elements;

each of said chips having a substantially parallelogram shape, wherein said first side of said chip intersects said second side of said chip at an oblique angle;

said light emitting elements being linearly arranged such that said light emitting elements form a line along said first side of said chip;

said line of said light emitting elements being located closer to said first side of said chip than to said third side of said chip;

said chips being positioned on said board such that each of said lines of said light emitting elements of each of said chips is aligned to form a line of said light emitting elements across said board;

said chips being positioned on said board in a staggered arrangement, wherein each of said first sides of said chips is alternately positioned with respect to said line of said light emitting elements across said board;

each of said chips having a first light emitting element positioned closest to said second side of said chip, wherein said first light emitting element has an outer side that is closest to said second side of said chip, wherein said outer side of said first light emitting element is parallel to said second side of said chip;

each of said chips having a last light emitting element positioned closest to said fourth side of said chip, wherein said last light emitting element has an outer side that is closest to said fourth side of said chip, wherein said outer side of said last light emitting element is parallel to said fourth side of said chip.

16. The module of claim 15, wherein each of said light emitting elements has a substantially parallelogram shape.

17. The module of claim 16, wherein a first side surface of said light emitting element intersects an adjacent second side surface of said light emitting element at an oblique angle.

18. The module of claim 15, wherein each of said light emitting elements comprises a light emitting diode.

19. The module of claim 15, wherein each of said light emitting elements has a light emitting function and a photosensing function.

20. The module of claim 19, wherein each of said light emitting elements selectively exhibits either said light emitting function or said photosensing function by switching an application direction of a bias voltage to said chips.

21. A print head comprising:

a support portion;

a board, wherein said board is supported by said support portion;

a plurality of chips positioned on said board, each of said chips having a first side, a second side, a third side located opposite said first side, and a fourth side located opposite said second side; and each of said chips having a plurality of light emitting elements;

each of said chips having a substantially parallelogram shape, wherein said first side of said chip intersects said second side of said chip at an oblique angle;

said light emitting elements being arranged linearly such that said light emitting elements form a line along said first side of said chip;

said line of said light emitting elements being located closer to said first side of said chip than to said third side of said chip;

said chips being positioned on said board such that each of said lines of said light emitting elements of each of said chips is aligned to form a line of said light emitting elements across said board;

said chips being positioned on said board in a staggered arrangement, wherein each of said first sides of said chips is alternately positioned with respect to said line of said light emitting elements across said board;

each of said chips having a first light emitting element positioned closest to said second side of said chip, wherein said first light emitting element has an outer side that is closest to said second side of said chip, wherein said outer side of said first light emitting element is parallel to said second side of said chip;

each of said chips having a last light emitting element positioned closest to said fourth side of said chip, wherein said last light emitting element has an outer side that is closest to said fourth side of said chip, wherein said outer side of said last light emitting element is parallel to said fourth side of said chip.

22. The print head of claim 21, wherein each of said light emitting elements has a substantially parallelogram shape.

23. The print head of claim 22, wherein said first side of said light emitting element intersects said second side of said light emitting element at an oblique angle.

24. The print head of claim 21, wherein each of said light emitting elements comprises a light emitting diode.

25. The print head of claim 21, wherein each of said light emitting elements has both a light emitting function and a photosensing function.

26. The print head of claim 25, wherein each of said light emitting elements selectively exhibits either said light emitting function or said photosensing function by switching an application direction of a bias voltage to said chips.

27. The print head of claim 21, wherein said print head has both a printing function and a reading/writing function.

28. The print head of claim 21, further comprising a rod lens array supported above said light emitting elements by a rod lens array holder.

* * * * *